(12) United States Patent
Yun et al.

(10) Patent No.: US 8,375,558 B2
(45) Date of Patent: Feb. 19, 2013

(54) SEMICONDUCTOR APPARATUS AND REPAIRING METHOD THEREOF

(75) Inventors: Tae Sik Yun, Ichon-shi (KR); Won Woong Seok, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 90 days.

(21) Appl. No.: 12/839,367

(22) Filed: Jul. 19, 2010

(65) Prior Publication Data
US 2011/0232078 A1 Sep. 29, 2011

(30) Foreign Application Priority Data
Mar. 29, 2010 (KR) ........................ 10-2010-0027897

(51) Int. Cl.
*G01R 31/28* (2006.01)
(52) U.S. Cl. ................ 29/593; 29/739; 29/760; 29/705; 324/762.01; 324/762.05; 324/762.06; 257/E21.521; 257/E21.531
(58) Field of Classification Search .................... 29/593, 29/706, 739, 760; 257/E21.521–E21.531; 438/14–18; 324/762.01, 762.05, 762.06
See application file for complete search history.

(56) References Cited

U.S. PATENT DOCUMENTS

| | | | | | |
|---|---|---|---|---|---|
| 4,691,287 | A | * | 9/1987 | Suzuki et al. ................. | 716/136 |
| 5,619,509 | A | * | 4/1997 | Maruyama et al. ........... | 714/707 |
| 6,169,410 | B1 | * | 1/2001 | Grace et al. .............. | 324/754.07 |
| 6,956,387 | B2 | * | 10/2005 | Ho et al. .................. | 324/756.05 |
| 7,317,256 | B2 | * | 1/2008 | Williams et al. ............. | 257/777 |
| 7,577,885 | B2 | * | 8/2009 | Hasegawa et al. ........... | 714/718 |
| 7,598,523 | B2 | * | 10/2009 | Luo et al. ........................ | 257/48 |
| 7,779,311 | B2 | * | 8/2010 | Ong ............................. | 714/710 |
| 7,797,591 | B2 | * | 9/2010 | Hasegawa et al. ........... | 714/710 |
| 7,825,517 | B2 | * | 11/2010 | Su ................................. | 257/774 |
| 7,973,310 | B2 | * | 7/2011 | Wang et al. ..................... | 257/48 |
| 8,044,395 | B2 | * | 10/2011 | Lee ................................. | 257/48 |
| 8,080,873 | B2 | * | 12/2011 | Tanaka et al. ................ | 257/723 |
| 8,248,096 | B2 | * | 8/2012 | Yun ........................... | 324/762.01 |
| 2006/0059398 | A1 | * | 3/2006 | Chang et al. .................. | 714/742 |
| 2008/0159029 | A1 | * | 7/2008 | Park ............................. | 365/201 |
| 2008/0272372 | A1 | * | 11/2008 | Luo et al. ........................ | 257/48 |
| 2008/0315388 | A1 | * | 12/2008 | Periaman et al. ............. | 257/690 |
| 2009/0020865 | A1 | | 1/2009 | Su | |
| 2009/0134500 | A1 | * | 5/2009 | Kuo ............................. | 257/659 |

(Continued)

FOREIGN PATENT DOCUMENTS
KR 1020000042474 A 7/2000
KR 1020050110077 A 11/2005

*Primary Examiner* — A. Dexter Tugbang
*Assistant Examiner* — Azm Parvez
(74) *Attorney, Agent, or Firm* — William Park & Associates Ltd.

(57) ABSTRACT

A semiconductor apparatus includes a semiconductor chip through-line for transmitting signals commonly to a plurality of stacked semiconductor chips. The apparatus includes a first test pulse signal transmission unit configured to transmit a first test pulse signal to a first end of the semiconductor chip through-line when a power-up operation is performed; a second test pulse signal transmission unit configured to transmit a second test pulse signal to a second end of the semiconductor chip through-line after the first test pulse signal is transmitted; a first signal reception unit coupled to the first end of the semiconductor chip through-line, and configured to receive signals transmitted from the first and second test pulse signal transmission units; and a second signal reception unit coupled to the second end of the semiconductor chip through-line, and configured to receive the signals transmitted by the first and second test pulse signal transmission units.

15 Claims, 2 Drawing Sheets

U.S. PATENT DOCUMENTS

2009/0166873 A1* 7/2009 Yang et al. .................... 257/758
2011/0066396 A1* 3/2011 Goerlich et al. .............. 702/116
2011/0113286 A1* 5/2011 Takasuka et al. ............... 714/30
2012/0018723 A1* 1/2012 Su et al. .......................... 257/48

* cited by examiner

SEMICONDUCTOR APPARATUS AND REPAIRING METHOD THEREOF

CROSS-REFERENCES TO RELATED APPLICATION

The present application claims priority under 35 U.S.C. §119(a) to Korean Application No. 10-2010-0027897, filed on Mar. 29, 2010, in the Korean Intellectual Property Office, which is incorporated herein by reference in its entirety as if set forth in full.

BACKGROUND

1. Technical Field

The present invention relates to a semiconductor apparatus, and, more particularly, to a technology for repairing semiconductor chip by way of semiconductor chip through-lines 2. Related Art Various packaging methods have been proposed to enhance the degree of integration of a semiconductor apparatus. Particularly, in a chip stacking method in which a plurality of semiconductor chips are stacked to construct a single semiconductor apparatus, semiconductor chip through-lines are used to transmit signals commonly to the plurality of semiconductor chips. Such semiconductor chip through-lines are often referred to as "through-silicon vias (TSVs)" because semiconductor chips are generally manufactured using silicon wafers.

In general, the stacked semiconductor chips can be categorized into a master chip and one or more slave chips. The master chip is configured to exchange signals with external devices and to control the slave chips. Each slave chip is configured to perform specific operations under the control of the master chip. For example, in the case of a semiconductor memory apparatus, the master chip has peripheral circuits associated with the input and output of signals and control signals, and the slave chips have memory banks for storing data. The circuit configurations of the master chip and the slave chips may be changed as needed.

Meanwhile, in a testing process of a semiconductor apparatus, a repair operation is performed to detect an occurrence of a defect in semiconductor chip through-lines and to replace a corresponding semiconductor chip through-line with a redundancy semiconductor chip through-line. Typically, whether a defect has been occurred is screened for the entire semiconductor chip through-lines using test equipment, and a semiconductor chip through-line which is determined to have failed is replaced with a redundancy semiconductor chip through-line. Such a repair operation is performed using a repair fuse. However, such a conventional repair scheme is problematic in that repair fuses occupy a substantial area and a defect in a semiconductor chip through-line that may potentially occur cannot be repaired.

SUMMARY

In one embodiment of the present invention, a semiconductor apparatus having a semiconductor chip through-line for transmitting signals commonly to a plurality of stacked semiconductor chips includes: a first test pulse signal transmission unit configured to transmit a first test pulse signal to a first end of the semiconductor chip through-line during a power-up operation; a second test pulse signal transmission unit configured to transmit a second test pulse signal to a second end of the semiconductor chip through-line after the first test pulse signal is transmitted; a first signal reception unit coupled to the first end of the semiconductor chip through-line, and configured to receive the first and second test pulse signals transmitted from the first and second test pulse signal transmission units, respectively; and a second signal reception unit coupled to the second end of the semiconductor chip through-line, and configured to receive the first and second test pulse signals transmitted from the first and second test pulse signal transmission units, respectively.

In another embodiment of the present invention, the semiconductor apparatus includes: a plurality of stacked semiconductor chips; a plurality of semiconductor chip through-lines configured to transmit signals commonly to the plurality of semiconductor chips; a first test pulse signal transmission unit configured to transmit a first test pulse signal to first ends of the plurality of semiconductor chip through-lines during a power-up operation; a second test pulse signal transmission unit configured to transmit a second test pulse signal to second ends of the plurality of semiconductor chip through-lines during the power-up operation; a plurality of first signal reception units each coupled to the first ends of the plurality of semiconductor chip through-lines, and configured to receive signals transmitted from the first and second test pulse signal transmission units; a plurality of second signal reception units each coupled to the second ends of the plurality of semiconductor chip through-lines, and configured to receive the signals transmitted from the first and second test pulse signal transmission units; and a repair unit configured to repair the plurality of semiconductor chip through-lines based on the signals received by the plurality of first signal reception units and the plurality of second signal reception units.

In another embodiment of the present invention, a method for repairing a semiconductor apparatus, which transmits signals commonly to a plurality of stacked semiconductor chips, includes the steps of: transmitting a first test pulse signal to a first end of a semiconductor chip through-line in response to a power-up signal; receiving the first test pulse signal through the first and second signal reception units, which are coupled to first and second ends of the semiconductor chip through-line; transmitting second test pulse signal to the second end of the semiconductor chip through-line; receiving the second test pulse signal through the first and second signal reception units, which are coupled to the first and second ends of the semiconductor chip through-line; and repairing the semiconductor chip through-line based on the first and second test pulse signals received by the first and second signal reception units.

BRIEF DESCRIPTION OF THE DRAWINGS

Features, aspects, and embodiments are described in conjunction with the attached drawings, in which.

DETAILED DESCRIPTION

Figure 1:
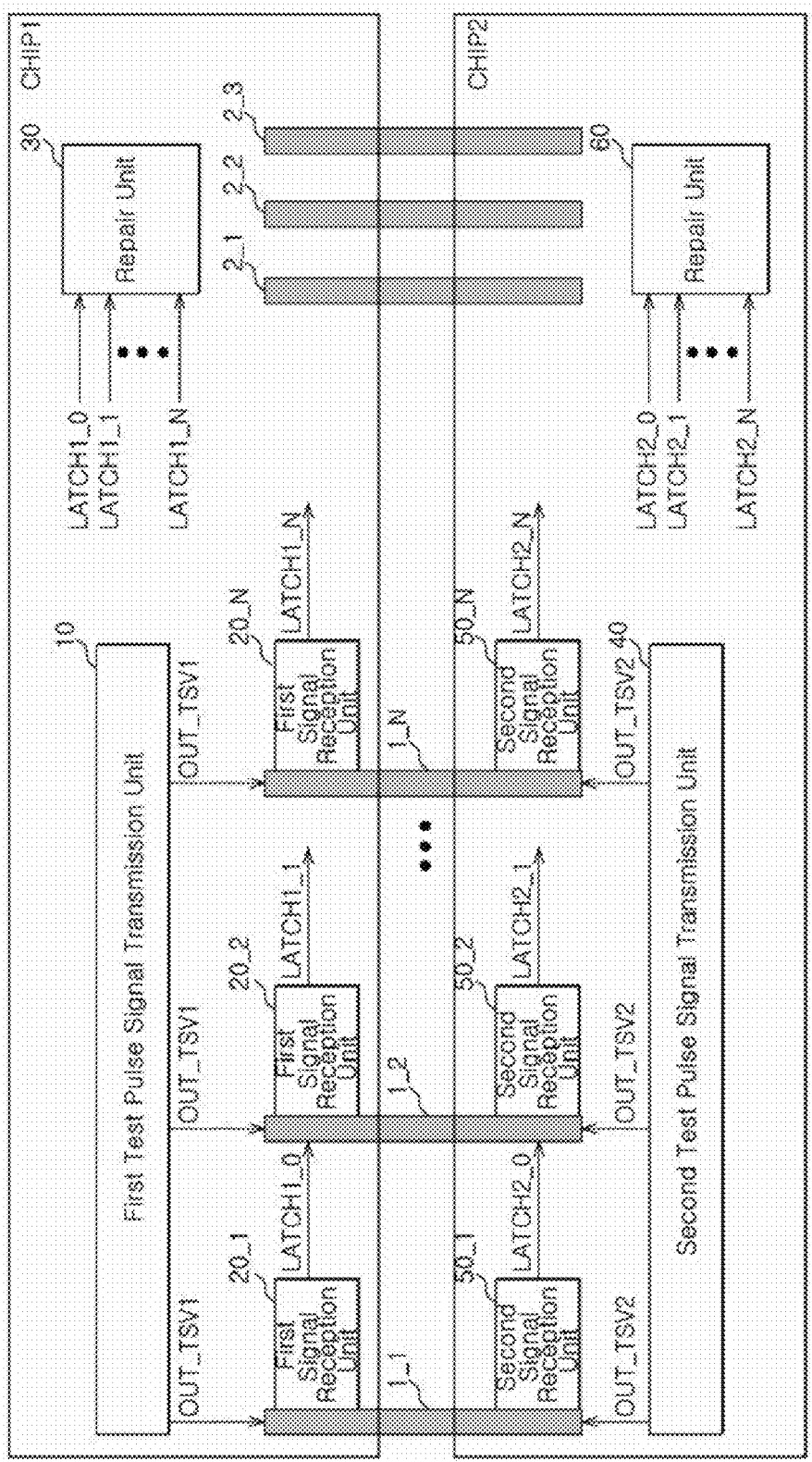
FIG. 1 is a conceptual block diagram of a semiconductor apparatus in accordance with an embodiment of the present invention.

Hereinafter, a semiconductor apparatus and a repairing method thereof according to the present invention will be described below with reference to the accompanying drawings through embodiments of the present invention. For references purposes, it should be noted that as the term, symbol or sign used in the drawings and detailed description to designate a device or block may reference detailed units as needed, the same term, symbol or sign may not designate the same device or block, in the entire circuitry.

FIG. 1 is a conceptual block diagram of a semiconductor apparatus in accordance with an embodiment of the present invention.

A semiconductor apparatus 1 in accordance with an embodiment of the present invention includes only a simplified configuration for the sake of clear description of the technical principles of the invention.

Referring to FIG. 1, the semiconductor apparatus 1 includes a plurality of stacked semiconductor chips CHIP1 and CHIP2; a plurality of semiconductor chip through-lines 1_1 to 1_N and 2_1 to 2_3, a first test pulse signal transmission unit 10, a second test pulse signal transmission unit 40, a plurality of first signal reception units 20_1 to 20_N, a plurality of second signal reception units 50_1 to 50_N, and repair units 30 and 60.

The detailed configuration and key operations of the semiconductor apparatus 1 configured as described above are described below.

In this embodiment of the present invention, the plurality of stacked semiconductor chips CHIP1 and CHIP2 include a first semiconductor chip CHIP1 and a second semiconductor chip CHIP2. It should be noted that at least two semiconductor chips may be stacked according to the embodiment.

The plurality of semiconductor chip through-lines 1_1 to 1_N and 2_1 to 2_3 transmit signals commonly to a plurality of semiconductor chips CHIP1 and CHIP2, respectively. The plurality of semiconductor chip through-lines 1_1 to 1_N comprise normal semiconductor chip through-lines, whereas the plurality of chip through-lines 2_1 to 2_3 comprise redundancy semiconductor chip through-lines 2_1 to 2_3.

The first test pulse signal transmission unit 10 transmits a first test pulse signal OUT_TSV1 to the first ends of the plurality of semiconductor chip through-lines 1_1 to 1_N during a power-up operation. Furthermore, the second test pulse signal transmission unit 40 transmits a second test pulse signal OUT_TSV2 to the second ends of the plurality of semiconductor chip through-lines 1_1 to 1_N during the power-up operation. The second test pulse signal OUT_TSV2 is transmitted to the second ends of the plurality of semiconductor chip through-lines 1_1 to 1_N after the first test pulse signal OUT_TSV1 is transmitted to the first ends of the plurality of semiconductor chip through-lines 1_1 to 1_N. In this embodiment, only the plurality of normal semiconductor chip through-lines 1_1 to 1_N, rather than the plurality of redundancy semiconductor chip through-lines 2_1 to 2_3, are screened for defects. In certain embodiments, the redundancy semiconductor chip through-lines may also be screened.

The plurality of first signal reception units 20_1 to 20_N are each coupled to one of the first ends of the plurality of semiconductor chip through-lines 1_1 to 1_N respectively, and receive the signals transmitted from the first and second test pulse signal transmission units 10 and 40. Furthermore, the plurality of second signal reception units 50_1 to 50_N are each coupled to one of the second ends of the plurality of semiconductor chip through-lines 1_1 to 1_N respectively, and receive the signals transmitted from the first and second test pulse signal transmission units 10 and 40.

The repair units 30 and 60 repair the plurality of semiconductor chip through-lines 1_1 to 1_N based on the signals received by the plurality of first signal reception units 20_1 to 20_N and the plurality of second signal reception units 50_1 to 50_N.

The above-described semiconductor apparatus 1 repairs the semiconductor chip through-lines, which transmit signals commonly to the plurality of stacked semiconductor chips CHIP1 and CHIP2, through a method described below. The process of screening the first semiconductor chip through-line 1_1 for defects and repairing it is described below to clearly describe the technical principles of the present invention.

First, when a power-up signal indicating power initialization is activated, the first test pulse signal transmission unit 10 transmits the first test pulse signal OUT_TSV1 to the first end of the first semiconductor chip through-line 1_1.

Next, the first and second signal reception units 20_1 and 50_1, which are coupled to the first and second ends of the first semiconductor chip through-line 1_1, receive the first test pulse signal OUT_TSV1 transmitted through the first semiconductor chip through-line 1_1. Here, if the first test pulse signal OUT_TSV1 is not received, the first semiconductor chip through-line 1_1 is in an electrically open state.

Next, the second test pulse signal transmission unit 40 transmits the second test pulse signal OUT_TSV2 to the second end of the first semiconductor chip through-line 1_1.

Next, the first and second signal reception units 20_1 and 50_1, which are coupled to the first and second ends of the first semiconductor chip through-line 1_1, receive the second test pulse signal OUT_TSV2 transmitted through the first semiconductor chip through-line 1_1. Here, if the second test pulse signal OUT_TSV2 is not received, the first semiconductor chip through-line 1_1 is in an electrically open state.

Finally, the repair units 30 and 60 detect defects in the first semiconductor chip through-line 1_1 from the first and second test pulse signals OUT_TSV1 and OUT_TSV2, which are received by the first and second signal reception units 20_1 and 50_1. If a defect is detected in the first semiconductor chip through-line 1_1, the repair units 30 and 60 repair the first semiconductor chip through-line 1_1 using the redundancy semiconductor chip through-lines 2_1 to 2_3. In other words, the repair units 30 and 60 determine that the first semiconductor chip through-line 1_1 is free of defects, only when the first and second test pulse signals OUT_TSV1 and OUT_TSV2 are accurately received by the first and second signal reception units 20_1 and 50_1.

Figure 2:
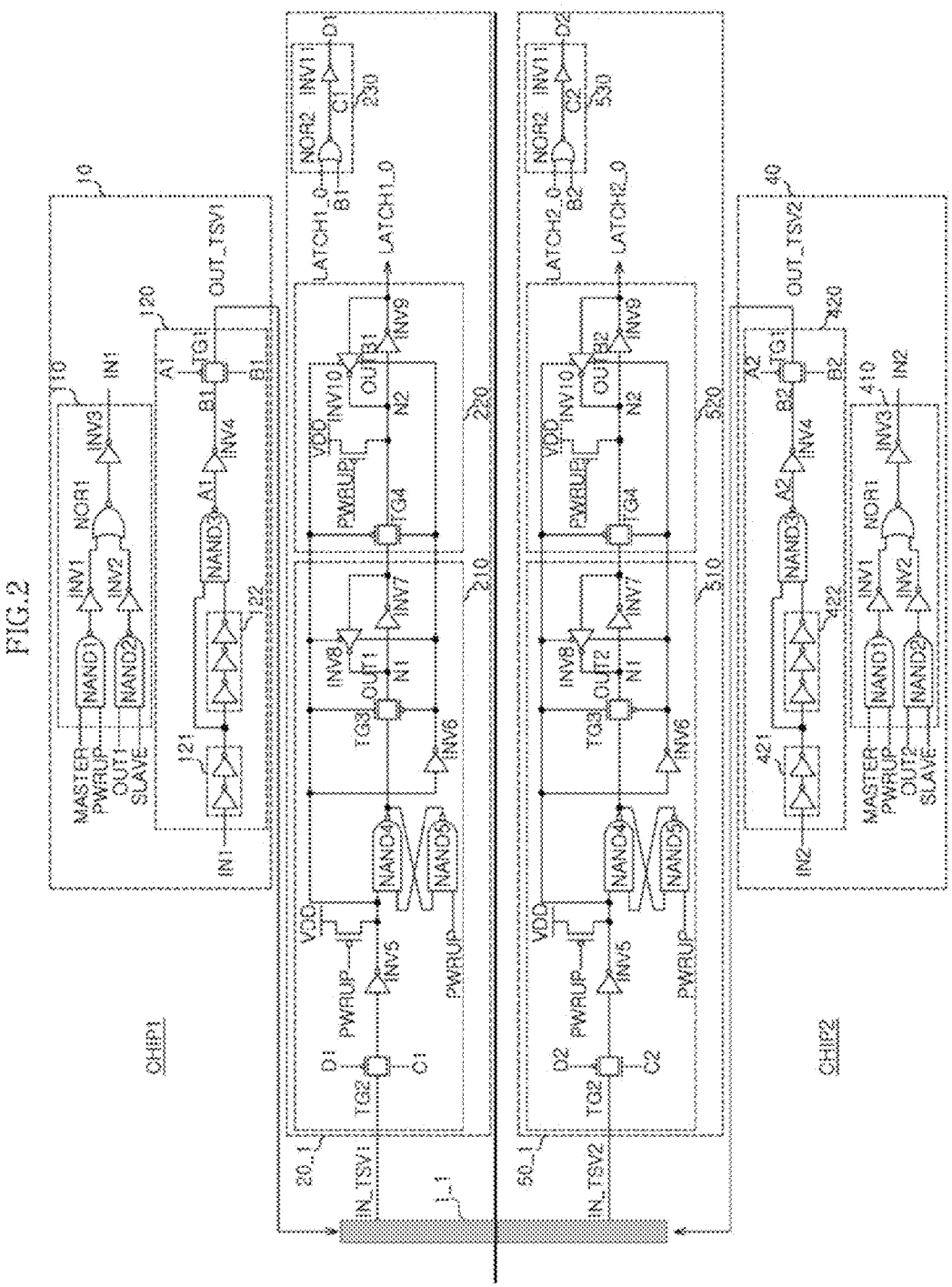
FIG. 2 is a circuit diagram illustrating a more detailed diagram of the semiconductor apparatus shown in FIG. 1.

FIG. 2 illustrates a more detailed diagram of the semiconductor apparatus shown in FIG. 1.

FIG. 2 illustrates in detail only a portion of the semiconductor apparatus 1 shown in FIG. 1 in order to clearly describe the technical aspects of the invention. Namely, FIG. 2 illustrates only the configuration of the portion that screens for defects in the first semiconductor chip through-line 1_1. It should be noted that the portions not specifically shown in FIG. 2 can be configured with the same circuits of the portion shown in FIG. 2, and can screen for defects in the semiconductor chip through-lines 1_2 to 1_N.

The detailed configuration and key operations of the semiconductor apparatus 1 are described below with reference to FIGS. 2 and 1.

The first test pulse signal transmission unit 10 includes a first input signal generation section 110 and a first pulse signal output section 120. The first input signal generation section 110 generates a first input signal IN1 in response to a power-up signal PWRUP and a first semiconductor chip signal MASTER. In a detailed embodiment of the present invention, the first input signal generation section 110 generates the first input signal IN1 under the additional control of a signal OUT1 from a node N1 of a first latch section 210 and a second semiconductor chip signal SLAVE. The power-up signal PWRUP is a signal which is activated from a low level to a high level during the power-up operation. In addition, the first semiconductor chip signal MASTER is a signal which is inputted to the first semiconductor chip CHIP1 at the high level. The second semiconductor chip signal SLAVE is a signal which is inputted to the second semiconductor chip CHIP2 at the high level. The level of the signal OUT1 from the node N1 of the first latch section 210 is determined by a signal transmitted through the first semiconductor chip through-line 1_1. The first pulse signal output section 120 is configured to delay the first input signal IN1 and output the first test pulse signal OUT_TSV1. In other words, the first pulse signal output section 120 generates the first test pulse signal OUT_TSV1 by delaying the first input signal IN1 through a first delay 121 and a second delay 122. In this embodiment of the present invention, the first test pulse signal OUT_TSV1 pulses at the high level for a predetermined interval.

The first signal reception unit 20_1 has a first control signal output section 230, the first latch section 210, and a second latch section 220. The first control signal output section 230 is configured output latch-enable signal C1 and D1 in response to the first test pulse signal OUT_TSV1 and a second latch signal LATCH1_0. It should be noted that the first test pulse signal OUT_TSV1, inputted to the first control signal output section 230, is a signal from a node B1 of the first pulse signal output section 120. The first latch section 210 is configured to latch a signal IN_TSV1, which is transmitted through the first semiconductor chip through-line 1_1, in response to the latch-enable signals C1 and D1. The second latch section 220 is configured to latch a signal which is outputted from the first latch section 210 and output the second latch signal LATCH1_0. Assuming that the first test pulse signal OUT_TSV1 and the second test pulse signal OUT_TSV2 are correctly transmitted through the first semiconductor chip through-line 1_1, that is, when the first semiconductor chip through-line 1_1 is not defective, the second latch signal LATCH1_0, outputted from the second latch section 220, is activated to the high level.

The second test pulse signal transmission unit 40 has a second input signal generation section 410 and a second pulse signal output section 420. The second input signal generation section 410 is configured to generate a second input signal IN2 in response to the power-up signal PWRUP and the second semiconductor chip signal SLAVE. In a detailed embodiment of the present invention, the second input signal generation section 410 generates the second input signal IN2 under the additional control of a signal OUT2 from a node N1 of a first latch section 510 and the first semiconductor chip signal MASTER. The power-up signal PWRUP is a signal which is activated from a low level to a high level during the power-up operation. The first semiconductor chip signal MASTER is a signal which is inputted to the first semiconductor chip CHIP1 at the high level. The second semiconductor chip signal SLAVE is a signal which is inputted to the second semiconductor chip CHIP2 at the high level. The level of the signal OUT2 from the node N1 of the first latch section 510 is determined by a signal transmitted through the first semiconductor chip through-line 1_1. The second pulse signal output section 420 is configured to delay the second input signal IN2 and output the second test pulse signal OUT_TSV2.

The second signal reception unit 50_1 includes a second control signal output section 530, the first latch section 510, and a second latch section 520. The second control signal output section 530 is configured to output latch-enable signals C2 and D2 in response to the second test pulse signal OUT_TSV2 and a second latch signal LATCH2_0. It should be noted that the second test pulse signal OUT_TSV2, inputted to the second control signal output section 530, is a signal from a node B2 of the second pulse signal output section 420. The first latch section 510 is configured to latch a signal IN_TSV2, transmitted through the first semiconductor chip through-line 1_1, in response to the latch-enable signals C2 and D2. The second latch section 520 is configured to latch a signal outputted from the first latch section 510 and output the second latch signal LATCH2_0. Assuming that the first test pulse signal OUT_TSV1 and the second test pulse signal OUT_TSV2 are correctly transmitted through the first semiconductor chip through-line 1_1, that is, when the first semiconductor chip through-line 1_1 is not defective, the second latch signal LATCH2_0, which is outputted from the second latch 520, is activated to the high level.

The entire operations of the first test pulse signal transmission unit 10, the first signal reception unit 20_1, the second test pulse signal transmission unit 40, and the second signal reception unit 50_1, which each perform the above-described operations, are described below.

First, when the power-up signal PWRUP is activated to the high level, the first test pulse signal transmission unit 10 transmits the first test pulse signal OUT_TSV1 to the first semiconductor chip through-line 1_1.

Next, the first signal reception unit 20_1 and the second signal reception unit 50_1 latch the first test pulse signal OUT_TSV1, which is transmitted through first semiconductor chip through-line 1_1, using the first latch sections 210 and 510.

Next, the second test pulse signal transmission unit 40 transmits the second test pulse signal OUT_TSV2 to the first semiconductor chip through-line 1_1.

Next, the first signal reception unit 20_1 and the second signal reception unit 50_1 receive the second test pulse signal OUT_TSV2, transmitted through the first semiconductor chip through-line 1_1. In this case, if the first semiconductor chip through-line 1_1 is not defective, the second latch signals LATCH1_0 and LATCH2_0, outputted from the second latch sections 220 and 520, become high level. If the first semiconductor chip through-line 1_1 is defective, both the second latch signals LATCH1_0 and LATCH2_0, outputted from the second latch sections 220 and 520, become low level.

For reference, in this embodiment of the present invention, the second test pulse signal transmission unit 40 is designed in such a way as not to transmit the second test pulse signal OUT_TSV2 to the first semiconductor chip through-line 1_1 when the first test pulse signal OUT_TSV1 is not correctly transmitted through the first semiconductor chip through-line 1_1, that is, when the first semiconductor chip through-line 1_1 is defective. Where the second test pulse signal OUT_TSV2 is not transmitted, it means that no signal pulsing at the high level is transmitted.

It is not necessary to provide the first test pulse signal transmission unit 10 and the second test pulse signal transmission unit 40 for each semiconductor chip through-line, and the first test pulse signal transmission unit 10 and the second test pulse signal transmission unit 40 may receive input signals by combining the signals of the nodes N1.

The semiconductor apparatus according to this embodiment of the present invention can screen the semiconductor chip through-lines for defects and perform a repairing operation, each time a power-up operation is performed. Accordingly, even a defect that develops progressively in the semiconductor chip through-lines can be screened and repaired. Also, since it is not necessary to provide repair fuses, the semiconductor apparatus may be advantageous in a spatial aspect.

Embodiments of the present invention have been described above in detail. Embodiments including additional component elements that do not directly relate to the technical principles of the present invention may be provided in order to describe the present invention in further detail. Moreover, the active high configuration or active low configuration for indicating the activated states of signals and circuits may vary depending on the embodiment. Moreover, in order to achieve the same functionality, the transistors may be configured differently as needed. Also, in order to achieve the same functionality, the logic gates may be configured differently as needed. Since such potential changes in the circuit are too numerous to mention and can be easily inferred by those skilled in the art, they are not enumerated here.

Those skilled in the art of the present invention will understand that this invention may be embodied in other forms without changing its technical principles or essential characteristics. Therefore, the embodiments described above should be understood as examples only, and not to be limiting in any way. The scope of the present invention is represented by the claims that follow, rather than by the detailed descriptions above. It should be understood that the claims and all changes and amendments thereto are included in the scope of the present invention.

What is claimed is:

1. A semiconductor apparatus, having a plurality of semiconductor chip through-lines, each through-line having a first end and a second end, for transmitting signals commonly to a plurality of stacked semiconductor chips, comprising:
   a first test pulse signal transmission unit configured to transmit first test pulse signals to the first ends of the semiconductor chip through-lines during a power-up operation;
   a second test pulse signal transmission unit configured to transmit second test pulse signals to the second ends of the semiconductor chip through-lines after the first test pulse signal is transmitted;
   a first signal reception unit coupled to at least one of the first ends of the semiconductor chip through-lines, and configured to receive the first and second test pulse signals transmitted from the first and second test pulse signal transmission units, respectively; and
   a second signal reception unit coupled to at least one of the second ends of the semiconductor chip through-lines, and configured to receive the first and second test pulse signals transmitted from the first and second test pulse signal transmission units, respectively.

2. The semiconductor apparatus according to claim 1, further comprising: a repair unit configured to detect whether the semiconductor chip through-line is defective, based on the first and second test pulse signals received by the first signal reception unit and the second signal reception unit and to repair the defective semiconductor chip through-line using a redundancy semiconductor chip through-line.

3. The semiconductor apparatus according to claim 1, wherein the first test pulse signal transmission unit comprises:
   a first input signal generation section configured to generate a first input signal in response to a power-up signal and a first semiconductor chip signal; and
   a first pulse signal output section configured to delay the first input signal to output the first test pulse signal.

4. The semiconductor apparatus according to claim 3, wherein the first signal reception unit comprises:
   a first control signal output section configured to output a latch-enable signal in response to the first test pulse signal and a second latch signal;
   a first latch section configured to latch a signal, which is transmitted through the semiconductor chip through-line, in response to the latch enable signal; and
   a second latch section configured to latch a first latch signal, which is outputted from the first latch section, and output the second latch signal.

5. The semiconductor apparatus according to claim 1, wherein the second test pulse signal transmission unit comprises:
   a second input signal generation section configured to generate a second input signal in response to the power-up signal and a second semiconductor chip signal; and
   a second pulse signal output section configured to delay the second input signal to output the second test pulse signal.

6. The semiconductor apparatus according to claim 5, wherein the second signal reception unit comprises:
   a second control signal output section configured to output a latch enable signal in response to the second test pulse signal and a second latch signal;
   a first latch section configured to latch a signal, which is transmitted through the semiconductor chip through-line, in response to the latch enable signal; and
   a second latch section configured to latch a first latch signal, outputted from the first latch section, to output the second latch signal.

7. The semiconductor apparatus according to claim 1, wherein the second test pulse signal transmission unit transmits the second test pulse signals to the second ends of the semiconductor chip through-lines when the first test pulse signal with a predetermined level is received by the second signal reception unit.

8. A semiconductor apparatus comprising:
   a plurality of stacked semiconductor chips;
   a plurality of semiconductor chip through-lines, each through-line having a first end and a second end, configured to transmit signals commonly to the plurality of semiconductor chips;
   a first test pulse signal transmission unit configured to transmit first test pulse signals to the first ends of the plurality of semiconductor chip through-lines during a power-up operation;
   a second test pulse signal transmission unit configured to transmit second test pulse signals to the second ends of the plurality of semiconductor chip through-lines during the power-up operation;
   a plurality of first signal reception units each coupled to at least one of the first ends of the plurality of semiconductor chip through-lines, and configured to receive signals transmitted from the first and second test pulse signal transmission units;
   a plurality of second signal reception units each coupled to at least one of the second ends of the plurality of semiconductor chip through-lines, and configured to receive the signals transmitted from the first and second test pulse signal transmission units; and
   a repair unit configured to repair the plurality of semiconductor chip through-lines based on the signals received by the plurality of first signal reception units and the plurality of second signal reception units.

9. The semiconductor apparatus according to claim 8, wherein the second test pulse signals are transmitted to the second ends of the plurality of semiconductor chip through-lines after the first test pulse signals are transmitted to the first ends of the plurality of semiconductor chip through-lines.

10. The semiconductor apparatus according to claim 8, wherein the plurality of semiconductor chip through-lines comprise:
one or more normal semiconductor chip through-lines; and
one or more redundancy semiconductor chip through-lines.

11. The semiconductor apparatus according to claim 8, wherein the first test pulse signal transmission unit comprises:
a first input signal generation section configured to generate a first input signal in response to a power-up signal and a first semiconductor chip signal; and
a first pulse signal output section configured to delay the first input signal and output the first test pulse signal.

12. The semiconductor apparatus according to claim 11, wherein each of the plurality of first signal reception units comprises:
a first control signal output section configured to output a latch enable signal in response to the first test pulse signal and a second latch signal;
a first latch section configured to latch a signal, which is transmitted through a corresponding semiconductor chip through-line, in response to the latch enable signal; and
a second latch section configured to latch the first latch signal, which is outputted from the first latch section, and output the second latch signal.

13. The semiconductor apparatus according to claim 8, wherein the second test pulse signal transmission unit comprises:
a second input signal generation section configured to generate a second input signal in response to the power-up signal and a second semiconductor chip signal; and
a second pulse signal output unit configured to delay the second input signal and output the second test pulse signal.

14. The semiconductor apparatus according to claim 13, wherein each of the plurality of second signal reception units comprises:
a second control signal output section configured to output a latch enable signal in response to the second test pulse signal and a second latch signal;
a first latch section configured to latch a signal, which is transmitted through a corresponding semiconductor chip through-line, in response to the latch enable signal; and
a second latch section configured to latch a first latch signal, which is outputted from the first latch section, and output the second latch signal.

15. The semiconductor apparatus according to claim 8, wherein the second test pulse signal transmission unit transmits the second test pulse signals to the second ends of the plurality of semiconductor chip through-lines when the first test pulse signal with a predetermined level is received by the plurality of second signal reception units.

* * * * *